United States Patent [19]
Mancini

[11] Patent Number: 5,661,443
[45] Date of Patent: Aug. 26, 1997

[54] APPARATUS AND METHOD FOR AN ASYMMETRICAL MULTI-POLE MONOLITHIC CRYSTAL FILTER HAVING IMPROVED PHASE RESPONSE

[75] Inventor: Brian M. Mancini, Carol Stream, Ill.

[73] Assignee: Motorola, Inc., Schaumburg, Ill.

[21] Appl. No.: 614,574

[22] Filed: Mar. 13, 1996

[51] Int. Cl.$^6$ .................................................. H03H 9/205
[52] U.S. Cl. ........................ 333/191; 310/320; 333/192
[58] Field of Search ................................ 333/187, 189, 333/191, 192; 310/320

[56] References Cited

U.S. PATENT DOCUMENTS

| 3,676,724 | 7/1972 | Berlincourt et al. | 333/191 X |
| 4,156,214 | 5/1979 | Arvanitis et al. | 333/191 |
| 4,281,300 | 7/1981 | Arvanitis | 333/192 |
| 4,329,666 | 5/1982 | Arvanitis | 333/191 |
| 4,342,014 | 7/1982 | Arvanitis | 333/191 |
| 4,423,394 | 12/1983 | Kinsman | 333/192 |
| 5,294,898 | 3/1994 | Dworsky et al. | 333/187 |

OTHER PUBLICATIONS

"Proceedings of the 39th Annual Frequency Control Symposium of Frequency Control"; The Motorola Multi–Pole Monolithic Filter Project, 1985. Dworsky et al.

"Monolithic Crystal Filter Design Using a Variational Coupling Approximation"; IEEE Transactions on Sonics and Ultrasonics, vol. SU–28, No. 4, Jul. 1981, pp. 277–283. Dworsky, L.N.

Primary Examiner—Benny T. Lee
Assistant Examiner—Barbara Summons
Attorney, Agent, or Firm—Gary J. Cunningham

[57] ABSTRACT

A multi-pole monolithic crystal filter (100) having at least three asymmetrically acoustically coupled resonators (104) on a piezoelectric blank (102) to provide an improved phase response (302). The resonators (104) are positioned substantially in inverse proportion to predetermined ladder network coupling coefficients to achieve an improved phase response filter. The ladder network coupling coefficients are selected from designs including Bessel, Gaussian, linear phase and equiripple models. In this way, a predetermined improved phase response (302) is obtained monolithically without discrete interstage tuning components.

18 Claims, 4 Drawing Sheets

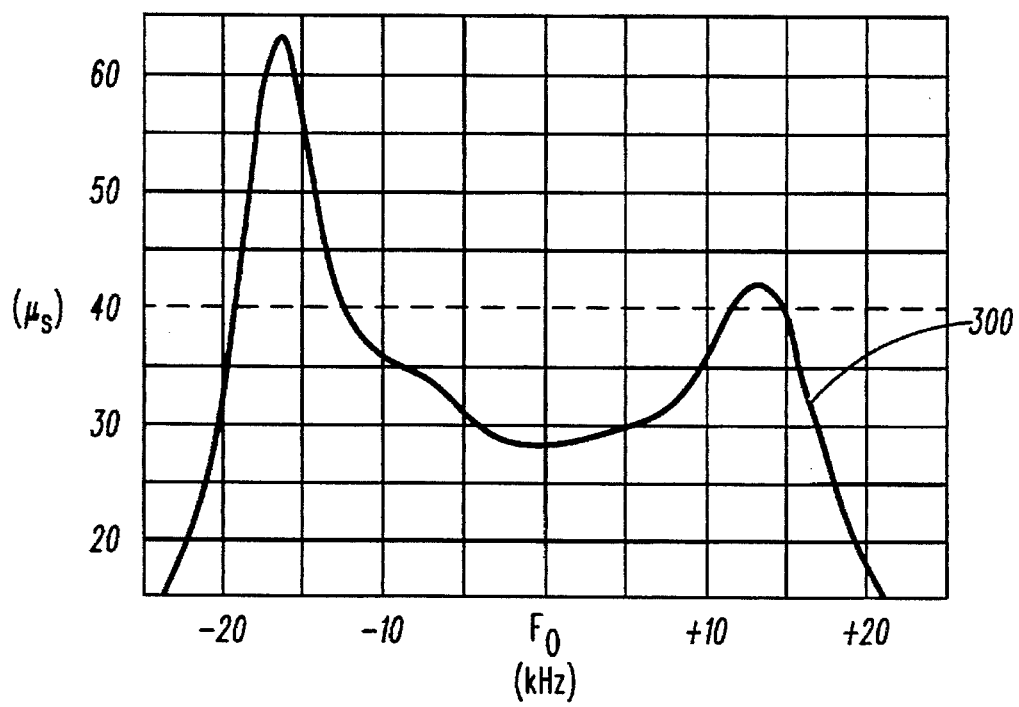
FIG.6 —PRIOR ART—
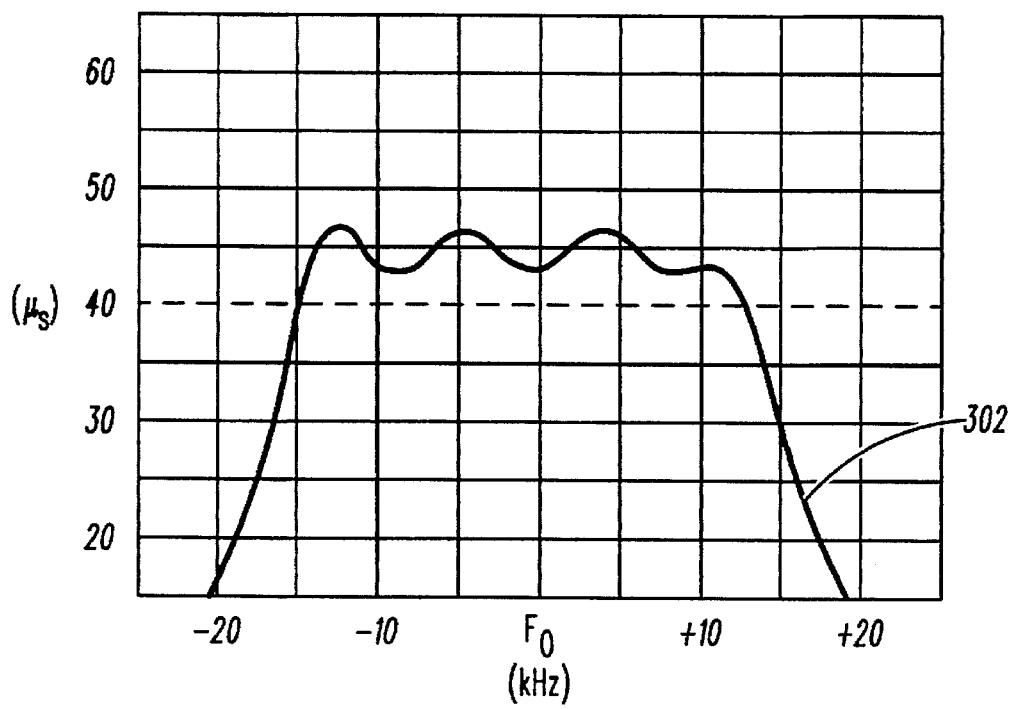
FIG.7

400

5,661,443

APPARATUS AND METHOD FOR AN ASYMMETRICAL MULTI-POLE MONOLITHIC CRYSTAL FILTER HAVING IMPROVED PHASE RESPONSE

FIELD OF THE INVENTION

The present invention relates generally to piezoelectric crystal filters and, in particular, to an apparatus and method for a multi-pole monolithic crystal filter having improved phase response.

BACKGROUND OF THE INVENTION

Piezoelectric crystal filters are commonly found in analog and digital radio communication devices. Typically, the same two-pole filter designs are used in both analog and digital applications, even though the radio requirements may be entirely different. Analog radio devices generally require filters to have a number of poles depending on the frequency response requirements of the radio. In the design of an analog radio, for example, the sensitivity and selectivity are specified and the designer incorporates filters having the requisite number of poles to provide the specified sensitivity and selectivity. If, for example, a two-pole filter will not provide the required selectivity, a four-pole monolithic crystal filter or two or more cascaded two-pole monolithic crystal filters may be used.

Digital radio devices generally require that filters provide a uniform phase response depending on the bit error rate (BER) requirements of the radio. In the design of a digital radio, for example, the group delay (change in phase over frequency) is specified and the designer incorporates predetermined discrete interstage coupling components or digital equalization to provide the specified group delay.

The design of discrete element filters of three or more poles and having uniform phase response for digital transmission are well known in the art and include Bessel, Gaussian, linear phase, equiripple, and others. However, multi-pole uniform phase response filters incorporating piezoelectric crystals in their design have been restricted to the use of single resonators or cascaded two-pole monolithic filters of a symmetric acoustic design.

FIG. 1 shows a prior art four-pole linear phase filter incorporating dual two-pole filters 10,12. The cascaded two-pole monolithic filters 10,12 are electrically coupled by asymmetric impedance matching networks to meet a phase response requirement. Generally, an input network includes a series connected capacitor 14 and a shunt connected inductor 22 and variable capacitor 18. An output network may include a series connected capacitor 16 and a shunt connected inductor 24 and variable capacitor 20. In order to provide a uniform phase response the components of the input network 14,18,22 are of different values and provide a different impedance match than the components of the output network 16,20,24. Further, the prior art design requires the use of interstage impedance matching components that typically include a shunt inductor 28 and variable capacitor 26. The interstage components 26,28 disadvantageously increase the cost and complexity of the filter and are very sensitive to tuning. In addition, individual variations between the filters 10,12 generally require the use of higher cost adjustable components 18,20,26 to allow tuning of the circuit to provide an appropriate frequency and phase response.

Radio designers have the option of using digital phase equalization of existing Tchebychev or Butterworth crystal filters or even providing filtering entirely in the digital domain without crystal filters. However, both of these options have the disadvantage of requiring the addition of an digital signal processing integrated circuit in the radio.

There is a need for a monolithic crystal filter having three or more poles and providing an improved phase response without the use of discrete interstage components or digital signal processing. Accordingly, an asymmetrically acoustically coupled multi-pole monolithic crystal filter would be an improvement over the prior art.

BRIEF DESCRIPTION OF THE DRAWINGS

FIG. 6 shows a group delay response of a prior art four-pole Tchebychev filter; and FIG. 7 shows a group delay response of a four-pole 0.5° linear phase filter, in accordance with the present invention.

DETAILED DESCRIPTION OF THE PREFERRED EMBODIMENT

Figure 2:
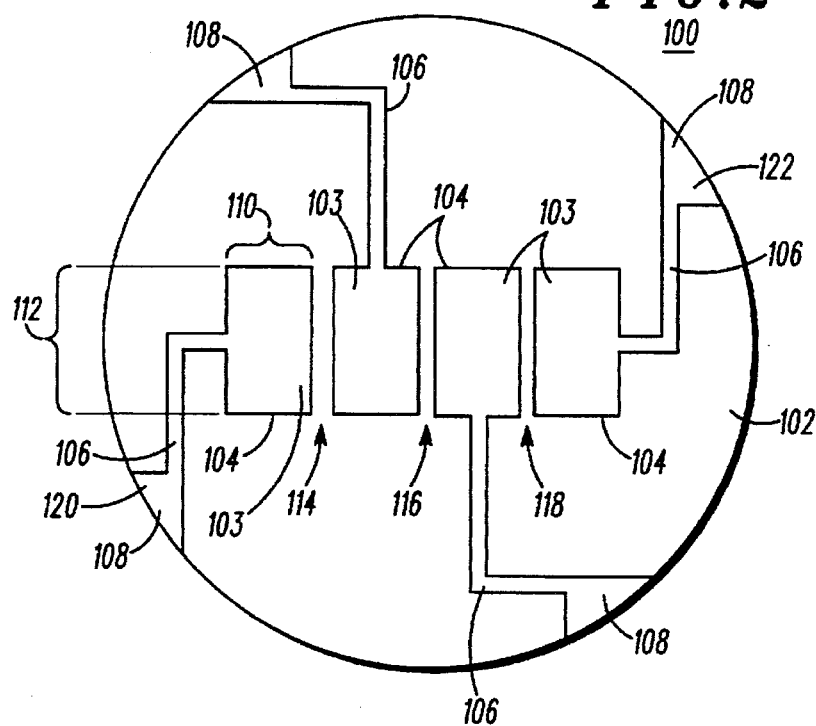
FIG. 2 shows a plan view of an asymmetrically acoustically coupled multi-pole monolithic filter, in accordance with the present invention.
Figure 3:
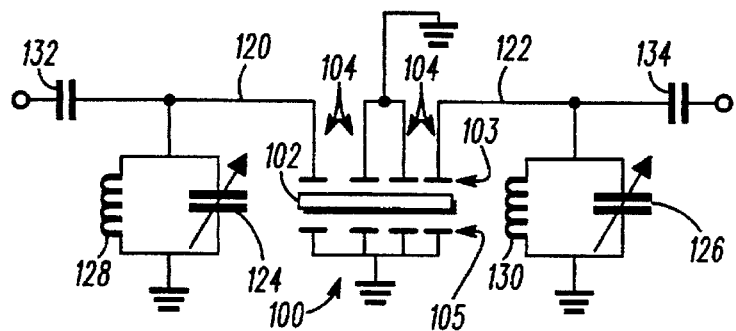
FIG. 3 shows an electrical schematic incorporating the filter of FIG. 2, and including asymmetric impedance terminations, in accordance with the present invention.

The present invention provides a multi-pole monolithic crystal filter 100 having an improved phase response without the use of interstage coupling components. As shown in FIGS. 2 and 3, the filter 100 includes a piezoelectric blank 102, typically quartz, having an upper and lower surface. The filter 100 includes at least three resonators 104 defined by substantially opposing top and bottom electrodes 103,105 deposed on the upper and lower surfaces of the blank 102, respectively. In one embodiment, there are four resonators 104, having top and bottom electrodes 103,105, all of the same dimensions, although this is not a necessary condition. The bottom electrodes 105 are electrically connected together, either on the blank 102 or through common connection in a package (not shown). Alternatively, the bottom electrodes 105 may be a substantially electrically continuous ground plane disposed on the blank 102, commonly connected to ground.

The resonators 104 are acoustically coupled through the piezoelectric blank 102. A first gap 114 between the first two resonators is different than a last gap 118 between a last two resonators. Alternatively, the gaps 114,116,118 may be defined as the distance between the center of one electrode to the center of an adjacent electrode. This is a more useful definition when electrode dimensions or area vary from resonator to resonator. In either instance, the positioning between the resonators 104 is asymmetric. In an embodiment utilizing an even number of electrical poles, as defined by an even number of resonators 104, as shown in FIG. 2, there is a middle gap 116 which is typically of a different size than either the first gap 114 or the last gap 118. An embodiment utilizing an odd number of poles will not have a middle gap, but will still exhibit a first gap and last gap of unequal dimension. A higher number of poles may be used equally well and will exhibit varying asymmetric gaps between resonators.

For the foregoing embodiments, the sizes of the gaps, or alternatively the center-to-center positions, between resonators 104 will be asymmetric as viewed from a center line (not shown) bisecting the blank 102. This also may be envisioned as the resonators 104 on a left-hand portion of the blank 102 not representing a mirror image of the resonators 104 on a right-hand portion of the blank 102. In a preferred embodiment, the resonators 104 are positioned colinearly, defined as the center of each resonator 104 lying substantially along a line substantially perpendicular to a center line bisecting the blank 102, but being spaced unequally along the line.

The amount of coupling between resonators 104 is substantially determined by their proximity to each other. Closer resonators typically have higher coupling. The difference in gaps 114, 118 causes an asymmetric coupling between resonators. It should be recognized that the resonators need not be located colinearly on the blank 102 or be of the same area or dimensions. However, it is a necessary condition that the resonators 104 be asymmetrically coupled to one another. Resonator coupling may be modeled for several predetermined improved phase response filters, such as Bessel, Gaussian, linear phase and equiripple designs that are well known in the art. Discrete component electrical ladder networks of such designs with normalized components values and coupling coefficients are known in the art. The present invention advantageously positions resonators substantially in proportion to the coupling coefficients of these ladder networks to realize an acoustic equivalent to these ladder network models in a multi-pole monolithic crystal filter. The coupling coefficients of the foregoing ladder network models are asymmetric which results in asymmetric acoustic coupling of the resonators of the filter. In a preferred embodiment, asymmetric acoustic coupling is achieved by asymmetric positioning of the resonators 104.

Also, in a preferred embodiment, the top electrodes 103 are connected by metallized traces 106 to mounting pads 108 located substantially on a periphery of the blank 102. Typically, the mounting pads 108 are used for wirebonding to electrical connections in a hermetic package (not shown). However, other connecting techniques known in the art, such as using conductive adhesives, may be used equally well. In general, connections to the filter 100 include an input 120, an output 122, and at least one ground.

Figure 1:
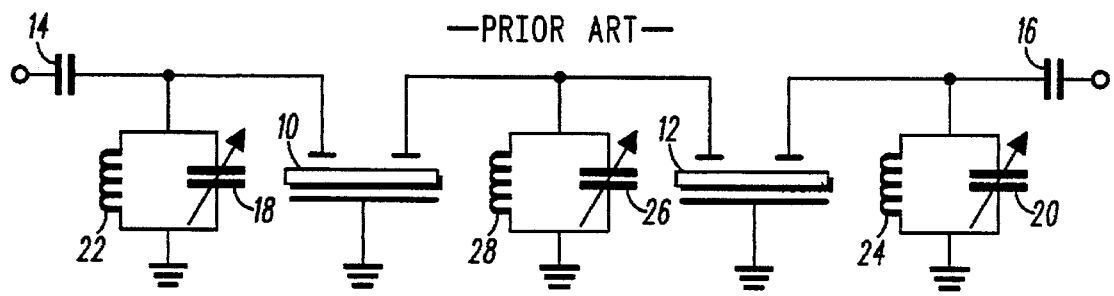
FIG. 1 shows an electrical schematic of a prior art linear phase filter.

Typically, asymmetric resonator coupling requires asymmetric impedance matching networks for the input 120 and output 122 of the filter 100 to realize a uniform phase response. These networks are generally used to complex conjugately impedance match the filter to a 50 ohm source or load. However, it should be recognized that other source and load impedances may be presented to the filter 100. As shown in FIG. 3, an input impedance matching network is connected to the input 120 of the filter 100 and includes a series capacitor 132 and a shunt inductor 128 and variable capacitor 124. An output impedance matching network is connected to the output 122 of the filter 100 and includes a series capacitor 134 and a shunt inductor 130 and variable capacitor 126. To accommodate the asymmetry of the filter 100, the input and output impedance matching networks are also asymmetric. In order to provide an improved phase response the components of input network 124,128,132 are of different values and provide a different impedance match than the components of the output network 126,130,134. It should be recognized that many other impedance matching configurations may be used successfully in the present invention. For example, low pass and high pass configurations may be used, and the matching from a filter to a source or load may be from either high-to-low impedance or low-to-high impedance, each requiring different circuitry. However, in substantially all cases, a complex conjugate impedance match is preferred to provide low insertion loss. The present invention advantageously eliminates the need for sensitive interstage elements as are needed in the prior art (see FIG. 1, inductor 28 and capacitor 26). More preferably, the electrode dimensions 110,112 are defined by photolithography. This advantageously provides a high degree of repeatability and accuracy such that the variable capacitors 124,126 may be economically substituted with fixed capacitors in most applications.

Figure 4:
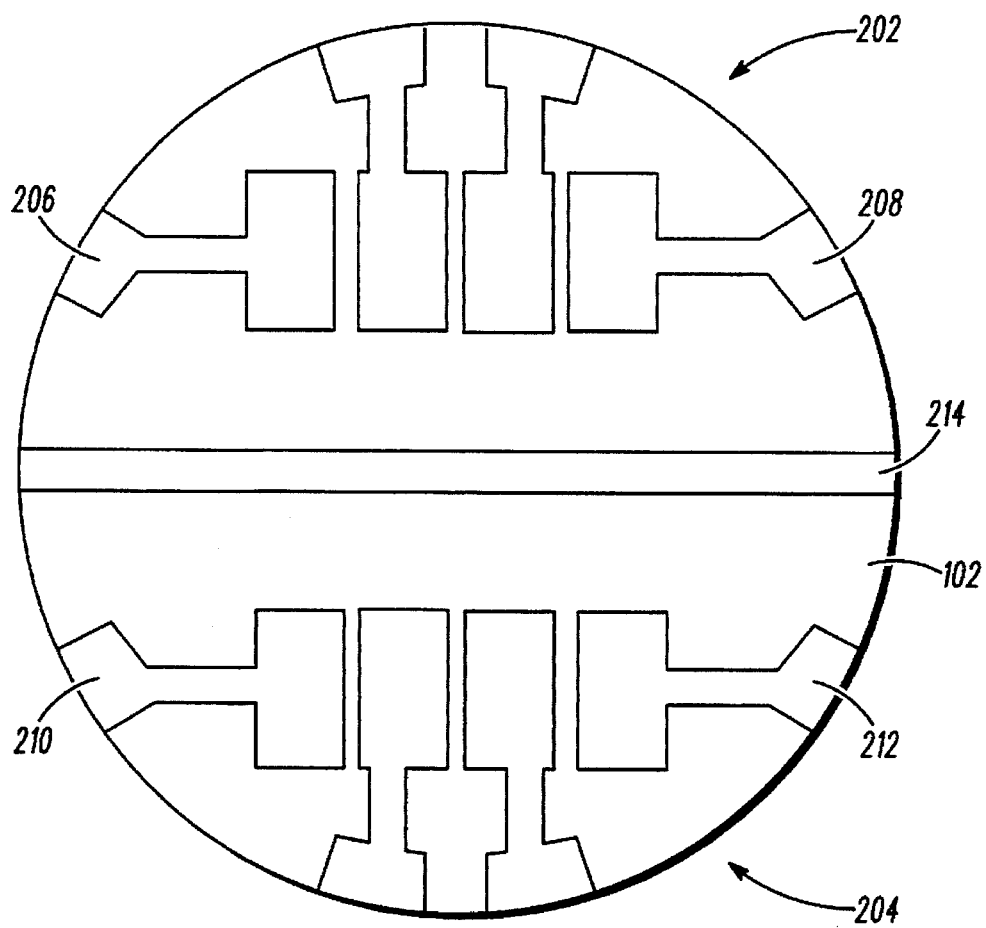
FIG. 4 shows a plan view of one embodiment of the present invention including dual four-pole linear phase filters on a single monolithic piezoelectric blank, in accordance with the present invention.
Figure 5:
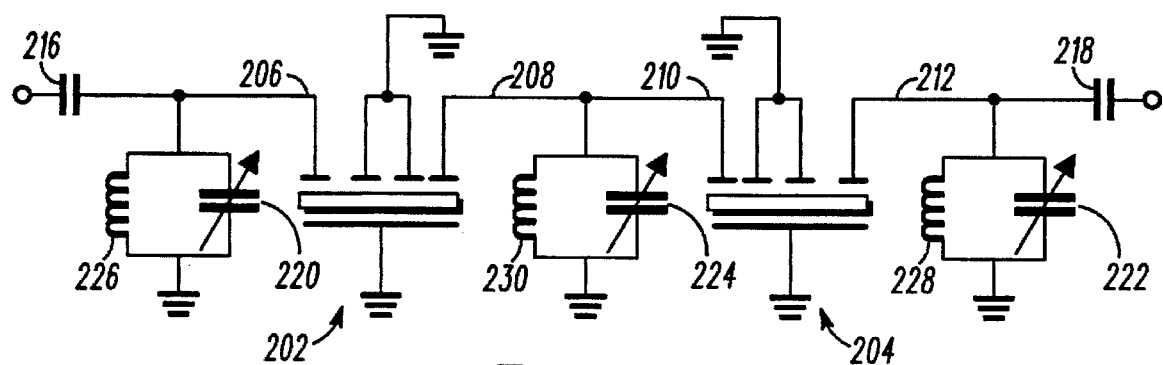
FIG. 5 shows an electrical schematic incorporating the linear phase filters of FIG. 4 in an eight-pole linear phase configuration and including symmetrical impedance terminations, in accordance with the present invention.

In a second embodiment of the invention, shown in FIGS. 4 and 5, two asymmetric filters 202,204, each substantially equivalent to the filter 100 of FIG. 2, may be cascaded to utilize symmetric impedance matching terminations. In this embodiment, an interstage impedance matching network is required to couple the two 4-pole filters 202,204 together to form an 8-pole improved phase filter. The interstage network includes a shunt capacitor 224 and coil 230, each of which may be variable or fixed, being connected to the output 208 of the first filter 202 and the input 210 of the second filter 204. Typically, filter response is sensitive to interstage components so at least one component is chosen to be variable. This embodiment includes an input impedance matching network connecting to the input 206 of the filter 202 and includes a series capacitor 216 and a shunt inductor 226 and variable capacitor 220. An output impedance matching network is connected to the output 212 of the filter 204 and includes a series capacitor 218 and a shunt inductor 228 and variable capacitor 222. The interstage network is of a different value than the input or output networks to accommodate the asymmetries of the filters 202,204. However, because the filters 202,204 are equivalent, the input 206 and output 212 present substantially the same terminating impedance.

Although this embodiment provides filters 202,204 having input and output impedance matching networks that are substantially equivalent and symmetric, it should be recognized that the two filters 202,204 may be different from each other, requiring differing matching networks. Also, it should be recognized that many other impedance matching configurations may be used successfully in this embodiment. For example, low pass and high pass configurations may be used, and impedance matching from a filter to a source or load may be from either high-to-low impedance or low-to-high impedance, each requiring different circuitry. However, in substantially all cases, a complex conjugate impedance match is preferred to provide low insertion loss.

The symmetric input and output terminations of this embodiment have the advantage of simplifying matching network design and allows the rotation of the package housing these filters 202,204 to improve performance. For example, if the filters 202,204 do not perform properly in a circuit application, an attempt could be made to improve performance by physically rotating the package 180° on a circuit board such that the output 212 now becomes the input and the input 206 now becomes the output. Rotation is allowable because the input and output terminations are substantially equivalent. This capability can be used advantageously in situations such as improving intermodulation distortion (IMD) performance of the device. Typically, IMD is caused by a degraded first input electrode of a filter. By allowing rotating of the package to exchange the relation of input and output electrodes, it may be possible to improve IMD performance by placing the degraded electrode at the output where it has substantially less IMD effect.

This embodiment also may be used in an application requiring redundant filtering. For example, if one filter 202 fails a performance test in a circuit, the package can be rotated 180° to substitute the second filter 204 in the circuit. This effectively doubles the opportunity to obtain a filter having satisfactory performance, and also effectively doubles the manufacturing yield of the device. Also, for a photolithographically produced device, the addition of a redundant filter on a monolithic blank does not add substantially to the cost of the device, In a preferred embodiment, a damping bar 214 is disposed on the blank 102 between filters 202,204 to attenuate undesired acoustic coupling between filters 202,204. The damping bar 214 is typically an epoxy or other suitable damping material.

Figure 8:
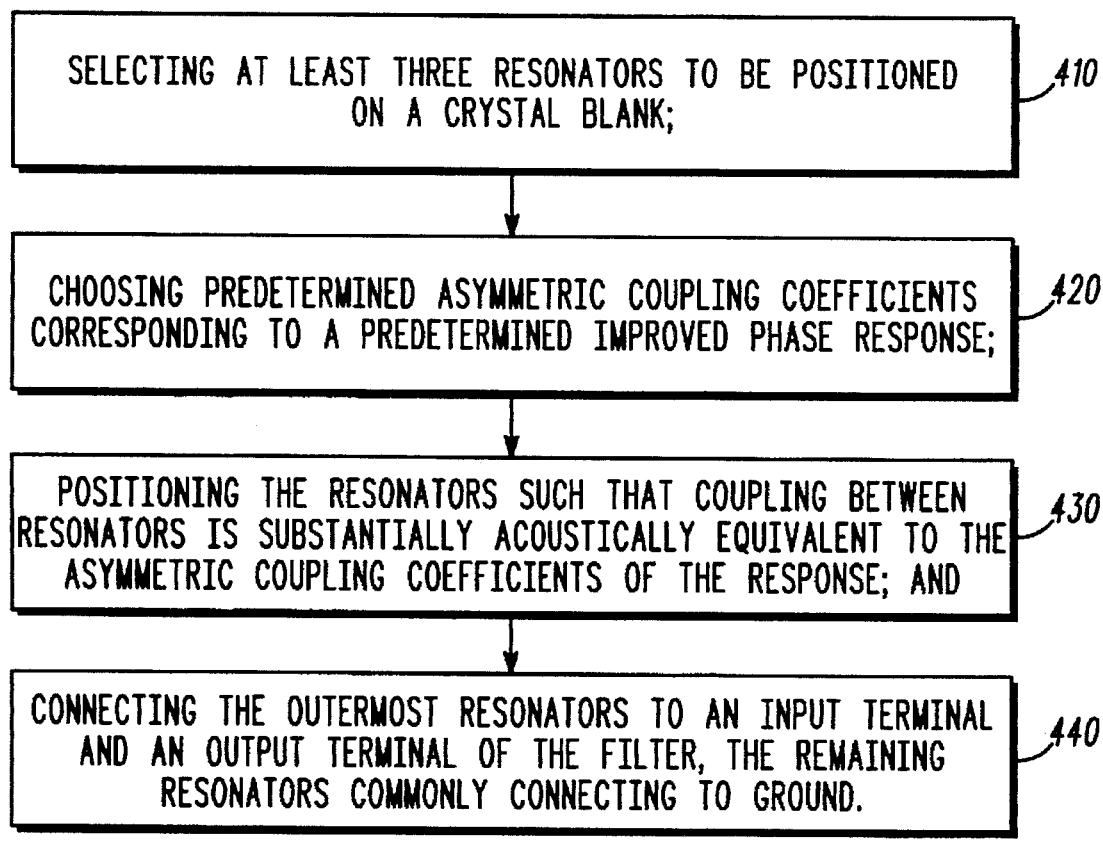
FIG. 8 shows a block diagram of a method for improving a phase response of a multi-pole monolithic crystal filter, in accordance with the present invention.

Referring to FIG. 8, a method 400 for improving the phase response of a multi-pole monolithic crystal filter is shown. The first step 410 provides for selecting at least three resonators to be positioned on a crystal blank. In a preferred embodiment, the blank is quartz and there are four resonators. The second step 420 provides for choosing predetermined asymmetric coupling coefficients corresponding to a predetermined improved phase response. Approximations for these coupling coefficients may be obtained for Bessel, Gaussian, linear phase and equiripple models. In a preferred embodiment, this step 420 includes choosing a first and second predetermined asymmetric impedance matching network required to conjugately match the foregoing models. The third step 430 provides for positioning the resonators such that coupling between resonators is substantially acoustically equivalent to the asymmetric coupling coefficients of the response corresponding to the model chosen. The coupling is substantially inversely proportional to the coupling coefficients. The last step 440 provides for connecting the top electrodes of the outermost resonators to an input terminal and an output terminal of a package of the filter, the remaining electrodes of the resonators are commonly connecting, preferably to ground. In a preferred embodiment, this step 440 includes connecting the first terminating impedance matching network to the input terminal and the second terminating impedance matching network to the output terminal of the filter such that the filter is complex conjugately matched to an application circuit to provide a substantially improved phase response.

COMPARATIVE EXAMPLE

The following experimental results serve to give an illustration of the practice of this invention, and are not intended in any way to limit the scope of this invention.

A four-pole monolithic crystal filter was designed as shown in FIGS. 2 and 3, to provide a 0.5° linear phase (equiripple) response on an AT-cut quartz blank. The normalized coupling coefficients (k and q values) have already been established for such a design in a ladder network configuration and may be found in many well known references. The reference used for this design was; A. I. Zverev, "Handbook of Filter Synthesis", Wiley, New York (1967), p.362. These coupling coefficients were used to provide an approximation for designing the crystal filters. The coefficients for this design are;

$q_1=0.5808$, $k_{12}=1.5752$, $k_{23}=0.7974$, $k_{34}=0.6559$, $q_4=1.0256$

The design of the invention was chosen to be similar to an existing four-pole monolithic Tchebychev design on AT-cut quartz and coupled in the Z-direction (Motorola part KFN6171A) in order to provide a baseline and compare the improvement in phase response that may be obtained by the invention. The existing Tchebychev design has a third overtone center frequency of 72.45 MHz and uses four resonators each having an equivalent motional inductance, Lm, of 17.8 mHy. The symmetric Tchebychev design is simple to realize because $q_1=q_4$ and $k_{12}=k_{34}$ which results in only three different coefficients being needed. For the Tchebychev design, $q_1=q_4=1.345$, $k_{12}=k_{34}=0.685$ and $k_{12}=0.542$. These coefficients have a symmetric relation and results in resonators being positioned substantially symmetrical to each other.

The invention was chosen to have resonators of the same dimension and area, and therefore the same 17.8 mHy motional inductance, and having a 3 db bandwidth of ±10 kHz. However, as can be seen by the non-symmetric coupling coefficients, the invention requires that the electrodes be positioned in a particular asymmetrical relation. This asymmetry is in relatively inverse proportion to the coefficients, as will be shown.

The area of the electrodes can be established using the well known crystal design equation;

$$A = d^3 \rho / 8 L m \epsilon^2$$

where

A is the area of the electrode ($m^2$).

d is the thickness of the blank, $6.85 \times 10^{-5}$ m.

$\rho$ is the density of quartz, 2650 $kg/m^3$.

$\epsilon$ is the corrected AT-quartz piezoelectric stress constant, 0.0881.

For a Lm of 17.8 mHy the area of an electrode equals 0.77 $mm^2$. An aspect ratio for a particular area is arbitrary. For the present invention, aluminum electrodes were deposited having a 1.17 mm X-dimension and a 0.66 mm Z-dimension and having a thickness of about 1700 Å. It should be recognized that various metals and thickness can be used with equal success.

The spacing between electrodes is approximated from the short-circuit bandwidths between electrodes. Using the coupling coefficients;

$BW_{sc12} = k_{12} * BW_{3db} = 1.5752 * 20 \text{ kHz} = 31.50 \text{ kHz}$ $BW_{sc23} = k_{23} * BW_{3db} = 0.7974 * 20 \text{ kHz} = 15.95 \text{ kHz}$ $BW_{sc34} = k_{34} * BW_{3db} = 0.6559 * 20 \text{ kHz} = 13.12 \text{ kHz}$ Larger short-circuit bandwidths indicate higher coupled resonators which in turn indicate more proximal resonator spacing. Preferably, the spacing between electrodes is determined empirically using the short-circuit bandwidths as a guide, but approximate spacings can be obtained by use of a variational coupling technique such as that described in; L. Dworsky, "Monolithic Crystal Filter Design Using a Variational Coupling Approximation", IEEE Transactions on Sonics and Ultrasonics, Vol. SU-28, No. 4, p.277, July 1981. For the chosen electrode dimensions and the calculated short-circuit bandwidths of 31.50, 15.95 and 13.12 kHz, and given that the resonators that are coupled in the Z-direction, the spacings between electrodes were defined to be 0.06, 0.14 and 0.16 mm, respectively. It should be recognized that the spacings between electrodes is relatively inversely proportional to the corresponding short-circuit bandwidths between electrodes. Also, it should be recognized that the resonators may be coupled in an X-direction or any other direction on the blank. In comparison, the spacings between electrodes for the existing Tchebychev design are 0.08, 0.10, 0.08 mm, respectively, which are symmetrical about a center line bisecting the filter and perpendicular to the colinear positions of the resonators. These spacings correspond to short circuit bandwidths of 25.62, 20.27, and 25.62 kHz, respectively.

The resonators of the filter of the present invention may be modeled by a method using an equivalent ladder network being coupled by T-sections which is known in the art. The values of the coupling inductors of the T-sections of the model are determined from the normalized k values of the coupling coefficients and the following equation;

$$Lk_n = k_n Lm(BW_{3db}/of)$$

where fo is the filter center frequency (MHz). For the present invention, $Lk_{12}=7.74\times10^{-6}$ μHy, $Lk_{23}=3.92\times10^{-6}$ μHy, and $Lk_{34}=3.22\times10^{-6}$ μHy, which demonstrates the asymmetric coupling. In contrast, the symmetric coupling inductances of the prior art Tchebychev filter are; $Lk_{12}=6.31\times10^{-6}$ μHy, $Lk_{23}=4.99\times10^{-6}$ μHy, and $Lk_{34}=6.31\times10^{-6}$ μHy. The terminating resistances of the filter of the present invention are determined from the normalized q values in the following equation;

$$R_{in/out} = 2\pi LmBW_{3db}/q_n$$

For $q_1=0.5808$, $R_{in}=3850\Omega$, and for $q_4=1.0256$, $R_{out}=2180\Omega$, which demonstrates the asymmetry of the terminations. The terminating resistances are in parallel with the static capacitance, Co, of the input and output resonator along with any parallel stray capacitances. Static capacitance, Co, is calculated from;

$$Co = \kappa \epsilon_o A/d$$

where κ is the dielectric constant of quartz, 4.54, and ε is the permittivity of free space, $8.85\times10^{-12}$, and Co is in pf. For the invention Co=0.45 pf, but in practice parallel stray capacitance from packaging adds about another 0.60 pf, to equal 1.05 pf. Complex conjugate impedance match networks for the asymmetric terminating impedances of 3850Ω, in parallel with 1.05 pf, and 2180Ω in parallel with 1.05 pf, can be easily accomplished by those skilled in the art.

A group delay of a filter is defined as a change in phase with frequency, or ∂φ/∂f. Filters exhibiting a substantially linear phase response will have a relatively flat group delay. FIG. 6 shows the group delay response 300 of the prior art baseline filter (Motorola part KFN6171A) for comparison purposes. This is a Tchebychev filter with a 3 db frequency bandwidth of ±16 kHz. Within the 3 db bandwidth, this filter exhibits a non-uniform group delay with a maximum-to-minimum operating range of about 32 μs. In comparison, FIG. 7 shows the group delay response 302 of the present invention. Within a designed 3 db frequency bandwidth of ±10 kHz, the invention shows a substantially flat and uniform group delay with an operating range of about 5 μs. As can be seen, the present invention has a much improved group delay response, due to a more linear phase response, over the baseline filter. This is important in reducing customer bit-error-rate, and eliminates a customer requirement for an additional DSP circuit to equalize non-uniform group delay responses.

It should be recognized that unequal sized resonators may be used to accomplish an improved phase response, also. For example, resonators having electrodes of unequal area, and therefore unequal Lm, may be acoustically coupled, either symmetrically or asymmetrically, to obtain an improved phase response. In this way, the asymmetry of resonator impedances, and therefore coupling, may be used to electrically simulate asymmetrical positioning of the resonators. Additionally, the resonators may be positioned colinearly or non-colinearly while achieving an improved phase response.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A multi-pole monolithic crystal filter, comprising:
a piezoelectric blank having an upper and a lower surface;
at least three resonators defined by substantially opposing electrode pairs, all of substantially the same area disposed substantially colinearly on the upper and lower surfaces of the blank; and
the resonators being acoustically coupled to each other and being asymmetrically positioned on the blank to provide a predetermined improved phase response.

2. A multi-pole monolithic crystal filter as in claim 1, wherein the at least three resonators includes at least four resonators being asymmetrically acoustically coupled free of interstage components.

3. A multi-pole monolithic crystal filter as in claim 1, wherein the piezoelectric blank is quartz.

4. A multi-pole monolithic crystal filter as in claim 1, wherein the response is selected from the group of designs consisting of Bessel, Gaussian, linear phase and equiripple.

5. A multi-pole monolithic crystal filter as in claim 4, wherein the resonators are positioned substantially in inverse proportion to predetermined asymmetric coupling coefficients substantially corresponding to the predetermined phase response.

6. A multi-pole monolithic crystal filter, comprising:
a piezoelectric blank having an upper and a lower surface;
at least three resonators defined by substantially opposing electrode pairs all of substantially the same area deposited on the upper and lower surfaces of the blank;
the resonators being acoustically coupled to each other and being positioned substantially colinearly on the blank and substantially perpendicular to a line bisecting the blank; and
the resonators are positioned asymmetrically to the line bisecting the blank and substantially in inverse proportion to predetermined asymmetric coupling coefficients substantially corresponding to a predetermined improved phase response.

7. A multi-pole monolithic crystal filter as in claim 6, wherein the piezoelectric blank is quartz.

8. A multi-pole monolithic crystal filter as in claim 6, wherein the response is selected from the group of designs consisting of Bessel, Gaussian, linear phase and equiripple.

9. A multi-pole monolithic crystal filter, comprising:
a piezoelectric blank having an upper and a lower surface;
at least two filters each including at least three resonators defined by substantially opposing electrode pairs all being of substantially the same area and providing substantially the same inductance, the resonators deposited substantially colinearly on the upper and lower surfaces of the blank and being substantially perpendicular to a line bisecting the blank; and the resonators of each of the at least two filters being positioned asymmetrically to the line bisecting the blank and substantially in inverse proportion to predetermined asymmetric coupling coefficients substantially corresponding to a predetermined improved phase response for each of the at least two filters, the resonators being acoustically coupled free of interstage components.

10. A multi-pole monolithic crystal filter as in claim 9, wherein the piezoelectric blank is quartz.

11. A multi-pole monolithic crystal filter as in claim 10, wherein the blank is of an AT-cut crystallographic orientation.

12. A multi-pole monolithic crystal filter as in claim 9, wherein the responses of each of the at least two filters are selected from the group of designs consisting of Bessel, Gaussian, linear phase and equiripple.

13. A multi-pole monolithic crystal filter as in claim 9, wherein the at least two filters are coupled to each other.

14. A multi-pole monolithic crystal filter as in claim 13, wherein the at least two filters consists of two filters, each filter having substantially equivalent responses and being coupled by a common interstage network such that substantially symmetric input and output impedances are presented at an input and output terminal, respectively.

15. A method of improving the phase response of a multi-pole monolithic crystal filter, comprising the steps of:

selecting at least three resonators each having a top and bottom electrode all being of substantially the same area to be positioned substantially colinearly on a crystal blank;

choosing predetermined asymmetric coupling coefficients substantially corresponding to a predetermined improved phase response;

positioning the resonators such that coupling between resonators is substantially acoustically equivalent to the asymmetric coupling coefficients of the response; and connecting the top electrodes of first and second outermost resonators to an input terminal and an output terminal respectively of a package for the filter, and commonly connecting the remaining electrodes to each other.

16. The method of claim 15, further comprising the step of providing first and second predetermined asymmetric complex conjugate impedance matching networks.

17. The method of claim 16, wherein the connecting step includes connecting the first and second impedance matching networks to the input and output terminals, respectively, such that the filter is impedance matched to an application circuit to provide a substantially improved phase response.

18. The method of claim 15, wherein the connecting step includes commonly connecting the remaining electrodes to ground.

* * * * *